United States Patent [19]

Rimshaw et al.

[11] Patent Number: 5,489,856

[45] Date of Patent: Feb. 6, 1996

[54] LASER-PROGRAMMABLE CLOCKED-LOGIC INTEGRATED-CIRCUIT

[75] Inventors: John A. Rimshaw, Elkridge; Daniel A. Anthony, Millersville, both of Md.

[73] Assignee: The United States of America as represented by the Director of the National Security Agency, Washington, D.C.

[21] Appl. No.: 409,233

[22] Filed: Mar. 24, 1995

[51] Int. Cl.⁶ .................................................. H03K 19/173
[52] U.S. Cl. .................... 326/38; 326/40; 326/39
[58] Field of Search .................... 326/37, 38, 39, 326/46, 40; 257/209

[56] References Cited

U.S. PATENT DOCUMENTS

| | | | |
|---|---|---|---|
| 4,240,094 | 12/1980 | Mader | 357/45 |
| 4,758,746 | 7/1988 | Birkner et al. | 307/465 |
| 4,857,773 | 8/1989 | Takata | 326/44 |
| 4,857,774 | 8/1989 | El-Ayat | 326/44 |
| 4,910,417 | 3/1990 | El Gamal | 326/41 |
| 4,912,345 | 3/1990 | Steele et al. | 307/465 |
| 4,937,475 | 6/1990 | Rhodes et al. | 307/465 |
| 5,357,153 | 10/1994 | Chiang et al. | 307/465 |

*Primary Examiner*—Edward P. Westin
*Assistant Examiner*—Andrew Sanders
*Attorney, Agent, or Firm*—Robert D. Morelli; Thomas O. Maser

[57] ABSTRACT

A laser-programmable clocked-logic integrated-circuit cell having a transmission gate; a first laser-cut area; a first two-input nand gate; a second two-input nand gate; a third two-input nand gate; a first inverter; a first tri-state clocked-inverter; a second laser-cut area; a second inverter; a third inverter; a second tri-state clocked-inverter; a third laser-cut area; a fourth two-input nand gate; a fifth two-input nand gate; a sixth two-input nand gate; a fourth inverter; a third tri-state clocked-inverter; a fourth tri-state clocked-inverter; a first laser-link area; a second laser-link area; a fourth laser-cut area; a fifth laser-cut area; and a third laser-link area.

6 Claims, 2 Drawing Sheets

5,489,856

LASER-PROGRAMMABLE CLOCKED-LOGIC INTEGRATED-CIRCUIT

FIELD OF THE INVENTION

This invention relates to clocked-logic integrated-circuits and, more particularly, to laser-programmable clocked-logic integrated-circuits.

BACKGROUND OF THE INVENTION

Programmable integrated-circuits are generally known and used to shorten design time, shorten processing time, or add flexibility to the art of circuit design.

The Massachusetts Institute of Technology (MIT) Lincoln Laboratory developed a laser-programmable logic module. This module is disclosed in U.S. Pat. No. 4,937,475, entitled "LASER PROGRAMMABLE INTEGRATED CIRCUIT." U.S. Pat. No. 4,937,475 is, hereby, incorporated by reference into the specification of the present invention.

It is desirable to have a programmable integrated-circuit that can be programmed with both open-circuits and short-circuits, contains sequential logic as well as combinatorial logic, is optimized for performance as well as area efficiency, can be synthesized easily, can be tested fully, and can be used in bus-intensive circuits. The combinatorial-logic circuit of U.S. Pat. No. 4,937,475 does not include sequential logic. Even though U.S. Pat. No. 4,937,475 can be used to build sequential circuits, the resulting circuit would not perform as well as a circuit that includes sequential logic in the basic logic cell. Also, the circuit of U.S. Pat. No. 4,937,475 cannot be accepted by a synthesis tool easily.

A synthesis tool, such as the one marketed by Synopsys, Inc. is used to optimize the intended circuit. That is, a designer would provide a hardware description of the intended circuit to the synthesis tool, and the synthesis tool would perform a Karnaugh-map-type reduction of the description. The hardware description of the circuit of U.S. Pat. No. 4,937,475 is quite complex and, therefore, not easily synthesized.

U.S. Pat. No. 4,240,094, entitled "LASER-CONFIGURED LOGIC ARRAY," discloses a laser-programmable combinatorial-logic circuit and a method of producing the same. The device of U.S. Pat. No. 4,240,094 suffers from the same disadvantages that U.S. Pat. No. 4,937,475 suffers from (i.e., no sequential-logic circuitry and not easily synthesized).

U.S. Pat. No. 4,758,746, entitled "PROGRAMMABLE LOGIC ARRAY WITH ADDED ARRAY OF GATES AND ADDED OUTPUT ROUTING FLEXIBILITY," discloses a laser-programmable (open-circuits only) sequential-logic circuit, but it is not optimized for performance or area. The circuit disclosed in U.S. Pat. No. 4,758,746 does not contain any buffering for the clock signal to the sequential-logic circuit (i.e., a flip-flop). Therefore, the number of loads seen by the clock signal is directly proportional to the number of logic cells used. Since performance is inversely proportional to the number of loads on the clock signal, the performance of the circuit of U.S. Pat. No. 4,758,746 is not optimal. The circuit of U.S. Pat. No. 4,758,746 appears to have been designed to handle many inputs. For most applications, a large number of inputs is not needed. The unused inputs, and the associated circuitry, represent wasted space. Designs that must be optimized for area cannot afford the luxury of having unnecessary circuitry.

U.S. Pat. No. 5,357,153, entitled "MACROCELL WITH PRODUCT-TERM CASCADE AND IMPROVED FLIP FLOP UTILIZATION," discloses a logic-programmable sequential-logic circuit as opposed to a laser-programmable circuit as the present invention does. The circuit of U.S. Pat. No. 5,357,153 does not have the flexibility, or the area efficiency, of the present invention.

U.S. Pat. No. 4,912,345, entitled "PROGRAMMABLE SUMMING FUNCTIONS FOR PROGRAMMABLE LOGIC DEVICES," discloses a sequential logic circuit that is programmable in the combinatorial-logic portion only. Such a circuit is less flexible than a circuit that is programmable in both the combinatorial-logic portion and the sequential-logic portion as the present invention is. Also, the circuit of U.S. Pat. No. 4,912,345 does not include a buffered clock signal, which entails less-than-optimal performance, and is not optimized for area.

SUMMARY OF THE INVENTION

It is an object of the present invention to create a laser-programmable clocked-logic cell that is both high performance and area efficient.

It is another object of the present invention to create a laser-programmable clocked-logic cell that can be configured as either a sequential-logic cell, a combinatorial-logic cell, or a combination thereof.

It is another object of the present invention to create a laser-programmable clocked-logic cell that is easily accepted by logic synthesis tools.

It is another object of the present invention to create a laser-programmable clocked-logic cell that may be configured to perform any combinatorial function.

It is another object of the present invention to create a laser-programmable clocked-logic cell that may be used in bus-intensive circuits.

It is another object of the present invention to create a laser-programmable clocked-logic cell that may be fully tested.

It is another object of the present invention to create a laser-programmable clocked-logic cell that can be programmed with both laser cuts and laser links.

The objects of the present invention are achieved with a laser-programmable clocked-logic cell that can be replicated many times on a single integrated-circuit to form a laser-programmable gate array. Gate array circuits are useful as general purpose integrated-circuits that can be configured to meet the functional needs of a user in a timely and cost-efficient manner.

The laser-programmable clocked-logic cell of the present invention may be configured as a sum-of-products cell. That is, the boolean expression that represents the combinatorial-logic programmed into the cell may be in the form of a sum of product terms (e.g., AB+CD+EF, where AB, CD, and EF are the product terms). A sum-of-products format is a format that is readily accepted by circuit synthesis tools. Some prior art programmable logic cells are not easily synthesized.

Although numerous programmable logic cells are known in the prior art, none have been optimized for flexibility (i.e., able to perform a wide range of functions), performance (i.e., speed), and area efficiency (i.e., size) as the present invention is.

The laser-programmable clocked-logic cell may be configured to perform all possible two-input logic functions (e.g., and, nand, or, nor, xor, xn or, etc.). Also, the cell includes a negative-triggered D-type flip-flop with asynchronous set and reset inputs. The flip-flop allows the cell to be configured as a sequential-logic cell. Furthermore, the cell 1 may be configured as a clocked latch.

The default configuration of the laser-programmable clockedlogic cell is a high-performance negative-triggered D-type flip-flop with asynchronous set and reset. The cell can be reconfigured by making laser cuts (open-circuits) and laser links (short-circuits). Only laser cuts are needed to reconfigure the cell as a combinatorial-logic cell.

Performance of the laser-programmable clocked-logic cell is maximized by including a clock-driver in the middle of the D-type flip-flop (i.e., between the master and slave sections of the D-type flip-flop). Having a clock-driver per cell provides higher performance than does a programmable cell without a clock-driver. Typically, numerous programmable cells without individual clock-drivers are placed in a row with one clock-driver at the end of the row. Since performance is inversely proportional to the number of loads on the clock signal, a circuit that uses a single clock-driver at the end of the row cannot be expected to perform as well as a circuit that uses the present invention.

Stability of the flip-flop of the present invention is assured by the inclusion of the clock-driver in the cell 1.

Programming of the laser-programmable clocked-logic cell is flexible enough to allow a second clock to be used to clock the sequential logic of the cell.

The laser-programmable clocked-logic cell has four inputs. The number four was chosen to maximize performance and minimize circuit area.

The laser-programmable clocked-logic cell includes a tri-state clocked-inverter on the output. The tri-state clocked— inverter allows the cell to be configured in ways that it, otherwise, could not. The tri-state clocked-inverter allows the present invention to be used in bus-intensive designs. Also, the tri-state clocked-inverter allows the final circuit to be fully tested.

A laser link (i.e., a short-circuit) is created by melting together two adjacent, and previously unconnected, metal lines. It is preferred that the metal Layer used to make links be the top-most metal layer (e.g., the second layer of metal). By using the top-most metal layer, a via can be opened over the two adjacent metal lines so that a more reliable laser link can be created.

The current carrying capability of a laser link appears to be dependent on the length of the link. In order to guarantee the reliability of the link, the link should be designed to carry at least as much current as either of the two metal lines can.

A laser cut (i.e., an open circuit) is created by heating a metal line to the point that a cross-section of the metal line is vaporized so that the metal line is physically, and electrically, severed. A laser cut can be made on any metal layer. It is preferred that laser cuts be made to the bottom-most metal layer (e.g., first layer metal).

DETAILED DESCRIPTION

Figure 1:
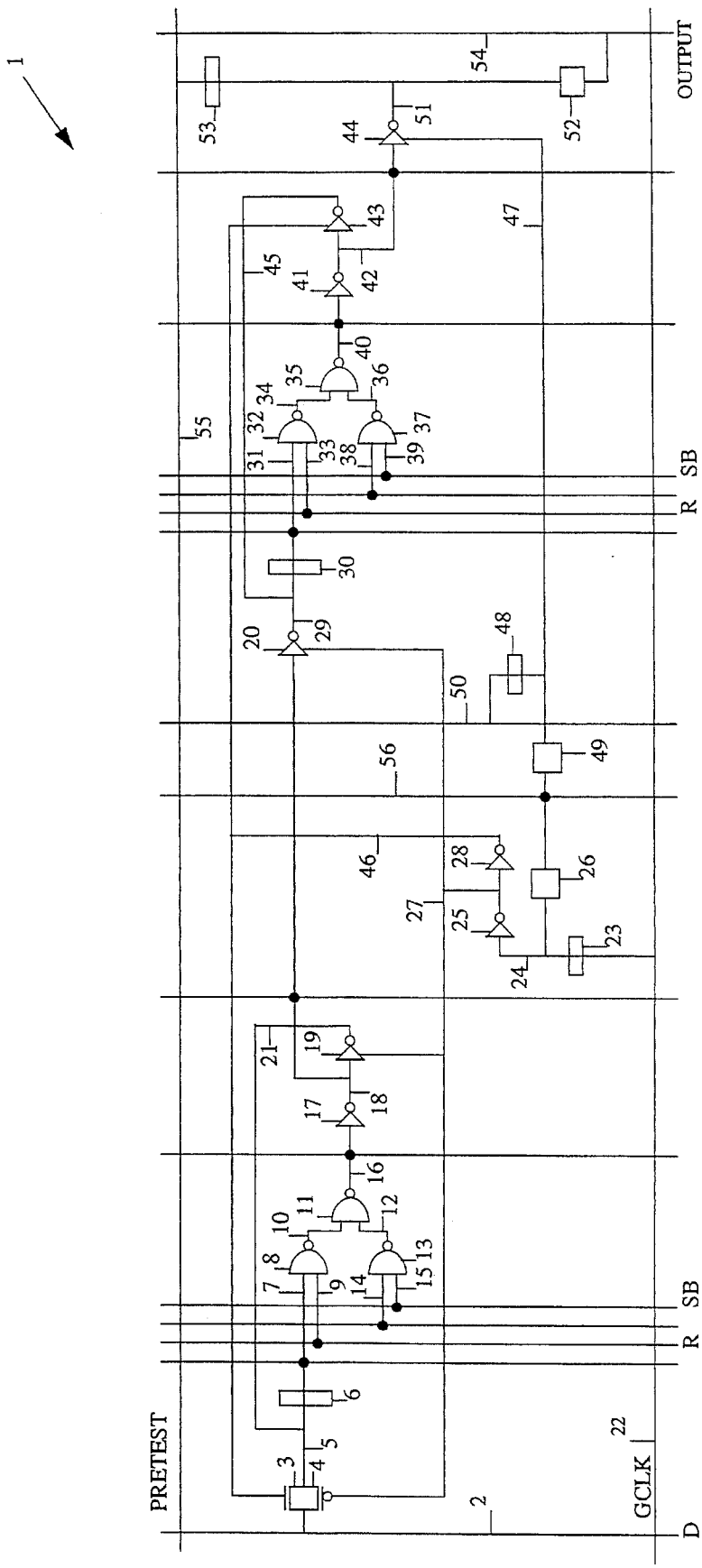
FIG. 1 is a schematic of a laser-programmable clocked-logic integrated-circuit.

The present invention, as depicted in FIG. 1, discloses a laser-programmable clocked-logic cell 1. The cell 1 may be configured as a sequential-logic circuit, a combinatorial-logic circuit, or a combination thereof. The default configuration of the cell 1 is a high-performance D-type flip-flop with asynchronous set and reset.

The input 2 to the flip-flop (i.e., D) is connected to the drain of an n-channel transistor 3 and the drain of a p-channel transistor 4. The input 2 traverses the entire cell 1 so that the input 2 can be connected to abutted cells. Typically, circuitry runs east to west and traversing signal-lines run north and south through the entire cell 1, but a ninety-degree rotation of this approach is possible.

The source 5 of the n-channel transistor 3 and the source 5 of the p-channel transistor 4 are connected together. The n-channel transistor 3 and the p-channel transistor 4 form a transmission gate. The source 5 of the n-channel transistor 3 is connected to the first side of a first laser-cut area 6. Each laser-cut area in the present invention is a portion of a metal line that can be viewed from the top of the resulting integrated circuit so that a laser can focus on the area. A laser-cut (i.e., an open-circuit) results when the laser vaporizes a cross-section of the metal line in the laser-cut area so that the metal line is physically, and electrically, severed. It is preferred that laser cuts be made to the bottom-most metal layer (i.e., first layer metal).

The second side of the first laser-cut area 6 is connected to the first input 7 of a first two-input nand gate 8. The first input 7 traverses the entire cell 1. The second input 9 of the first nand gate 8 traverses the entire cell 1. The output 10 of the first nand gate 8 is connected to the first input of a second two-input nand gate 11. The second input 12 of the second nand gate 11 is connected to the output of a third two-input nand gate 13. The first input 14 and the second input 15 of the third nand gate 13 traverse the entire cell 1.

When the cell 1 is used as a sequential-logic cell, the second input 9 of the first nand gate 8 is the reset signal to the master portion of the flip-flop within the cell 1, while the second input 15 of the third nand gate 13 is the inverted set signal (i.e., set-bar) to the master portion of the flip-flop of the cell 1. The master portion of the cell 1 may be configured as a positive-triggered clocked-latch.

When the cell 1 is used as a combinatorial-logic cell, the first hand gate 8, the second nand gate 11, and the third nand gate 12 may be used independently of any other circuitry within the cell 1 as a four-input sum-of-products cell.

The output 16 of the second hand gate 11 is connected to the input of a first inverter 17. The output 16 of the second nand gate 11 traverses the entire cell 1. The output 18 of the first inverter 17 is connected to the input of a first tri-state clocked-inverter 19 and the input of a second tri-state clocked-inverter 20. The output 18 of the first inverter traverses the entire cell 1.

The output 21 of the first tri-state clocked-inverter 19 is connected to the source 5 of the n-channel transistor 3.

A high-speed global-clock signal line 22 (i.e., GCLK) runs east to west (or north to south in a rotated configuration) through the entire cell 1. To maximize performance of a sequential-logic configuration, GCLK 22 is made wider than the other signal lines in the cell 1.

GCLK 22 is connected to the first side of a second laser-cut area 23. The second side of the second laser-cut area 23 is connected to the input 24 of a second inverter 25 and to the first side of a first laser-link area 26. Each laser-link area in the present invention is as described below. The output 27 of the second inverter 25 is connected to the input of a third inverter 28, the gate of the p-channel transistor 4, the clock-input of the first tri-state clocked-inverter 19, and the clock-input of the second tri-state clocked-inverter 20.

The second inverter 25 and the third inverter 28 forms a clock-driver within the cell 1. The clock-driver is used to optimize the performance of the cell 1 when the cell 1 is configured as a sequential-logic cell. The default configuration of the cell 1 is a high-performance negative-triggered D-type flip-flop. The combinatorial-logic disclosed so far forms the master portion of the default flip-flop of the cell. When not used in the default condition, the master portion of the cell 1 may be configured as combinatorial logic or as a positive-triggered clocked-latch. It is preferred that the clock-driver (i.e., second inverter 25 and third inverter 28) be physically located in the middle of the cell 1 (i.e., between the master and slave portion of the default flip-flop) in order to optimize the performance of the cell 1.

The output 29 of the second tri-state clocked-inverter 20 is connected to the first side of a third laser-cut area 30. The second side of the third laser-cut area 30 is connected to the first input 31 of a fourth two-input nand gate 32. The first input 31 of the fourth hand gate 32 traverses the entire cell 1. The second input 33 of the fourth nand gate 32 traverses the entire cell 1. The output 34 of the fourth nand gate 32 is connected to the first input of a fifth two-input nand gate 35. The second input 36 of the fifth nand gate 35 is connected to the output of a sixth two-input nand gate 37. The first input 38 and the second input 39 of the sixth nand gate 37 traverse the entire cell 1.

When the cell 1 is used as a sequential-logic cell, the second input 33 of the fourth nand gate 32 is the reset signal to the slave portion of the flip-flop within the cell 1, while the second input 39 of the sixth nand gate 37 is the inverted set signal (i.e., set-bar) to the slave portion of the flip-flop of the cell 1. The slave portion of the cell 1 may be configured as a negative-triggered clocked-latch.

When the cell 1 is used as a combinatorial-logic cell, the fourth hand gate 32, the fifth hand gate 35, and the sixth nand gate 37 may be used independently of any other component within the cell 1 as a four-input sum-of-products cell.

The output 40 of the fifth nand gate 35 is connected to the input of a fourth inverter 41. The output 40 of the fifth nand gate 35 traverses the entire cell 1. The output 42 of the fourth inverter 41 is connected to the input of a third tri-state clocked-inverter 43 and the input of a fourth tri-state clocked-inverter 44. The output 42 of the fourth inverter 41 traverses the entire cell 1.

The output 45 of the third tri-state clocked-inverter 43 is connected to the output 29 of the second tri-state clocked-inverter 20. The output 46 of the third inverter 28 is connected to the gate of the n-channel transistor 3 and the clock-input of the third tri-state clocked-inverter 43.

The fourth tri-state clocked-inverter 44 has a clock-input 47 connected to the first side of a fourth laser-cut area 48 and the first side of a second laser-link (i.e., short-circuit) area 49. The second side 50 of a fourth laser-cut area 48 traverses the entire cell 1.

The output 51 of the fourth tri-state clocked-inverter 44 is connected to the first side of a third laser-link area 52 and the first side of a fifth laser-cut area 53. The second side of the third laser-link area 52 is connected to the output 54 of the cell 1. The output 54 of the cell 1 traverses the entire cell 1. The second side of the fifth laser-cut area 53 is connected to a PRETEST signal line 55 which runs the length of the entire cell 1 (i.e., east to west in the typical orientation and north to south in a ninety-degree rotation from the typical orientation).

A second clock signal 56 traverses the entire cell 1 and is connected to the second side of the first laser-link area 26 and the second side of the second laser-link area 49. If the user wishes to operate the flip-flop with the second clock signal 56, the user would focus a laser on the second laser-cut area 23 to disconnect the GCLK 22 from the second inverter 25 and focus a laser on the first laser-link area 26 to connect the second clock signal 56 to the second inverter 25. Notice that the second clock signal 56 can also be connected to the clock-input 47 of the fourth clocked-inverter 44 via the second laser-link area 49.

Figure 2:
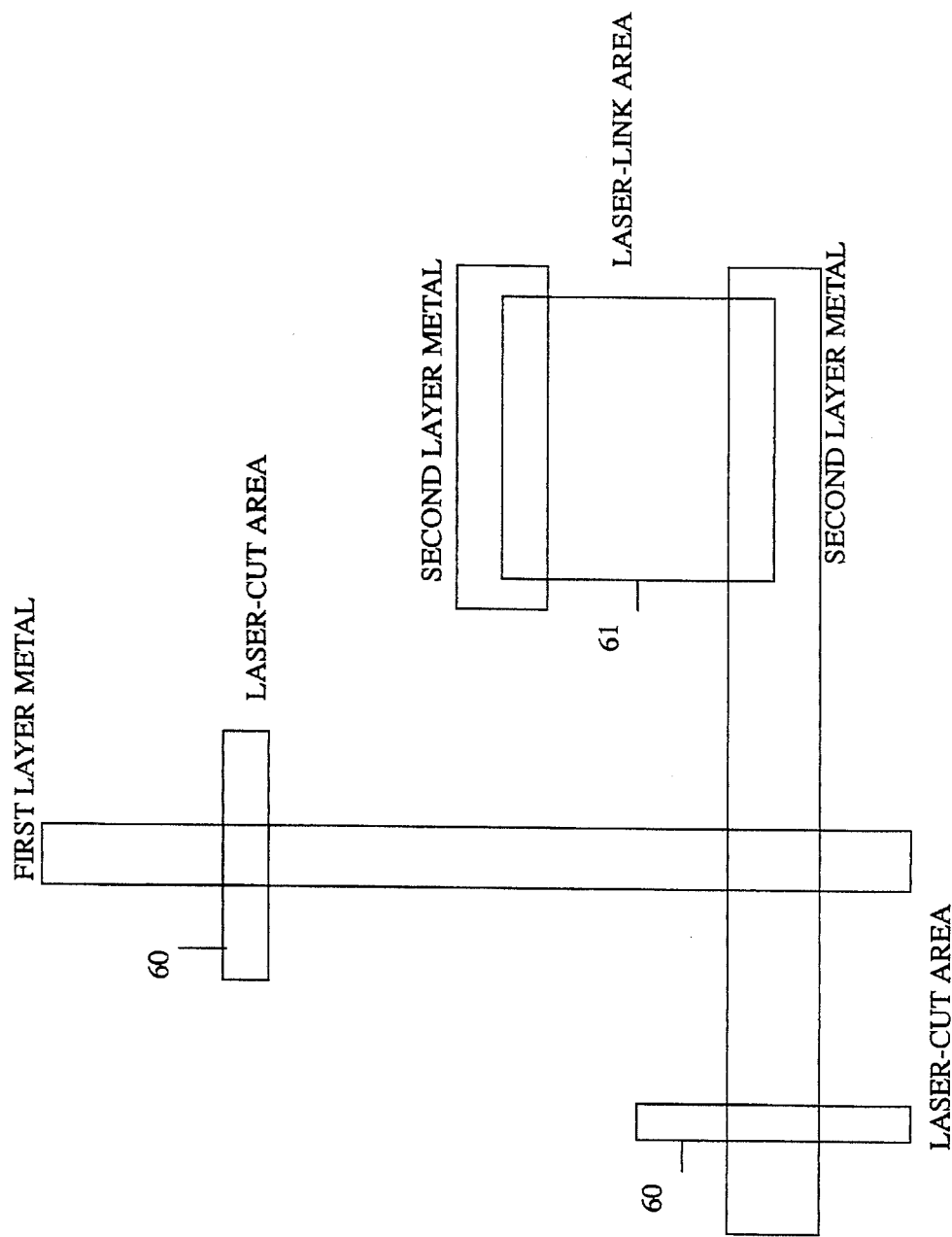
FIG. 2 is a diagram of the laser open-circuit and short-circuit employed in the present invention.

FIG. 2 illustrates the laser-cut areas 60 and the laser-link areas 61 used in the present invention. Laser-cut areas 60 are areas of metal that a laser can focus on in order to vaporize a cross-section of the metal line so that the metal line is physically, and electrically, severed. In the preferred embodiment, the laser-cut areas 60 are used in the bottom-most metal layer (i.e., first level metal). This scheme is used because it is relatively easy for a laser to penetrate to the lowest metal layers of an integrated-circuit in order to vaporize a cross-section of a metal line. When such a scheme is employed, the user must guarantee that the laser-cut areas 60 are accessible by a laser (i.e., laser light can be focused on the laser-cut area 60 without being obstructed by some other circuitry).

Laser-link areas 61 are adjacent metal lines (i.e., metal lines on the same metal layer) having a via (i.e., an opening in the oxide) over the two adjoining metal lines. In the preferred embodiment, the laser-link areas are formed on the top-most metal layer (e.g., second layer metal). This scheme is used because the power of the laser must be controlled so that the two adjoining metal lines are heated to the point that the metal from the two lines flow toward each other to create a metal link. The intensity of the laser must not be so strong as to vaporize the metal line.

What is claimed is:

1. A laser-programmable clocked-logic integrated-circuit cell, comprising:

(a) a transmission gate, having an input that traverses said cell, having a first control-input, having a second control-input, and having an output;

(b) a first laser-cut means comprising a metal line having a first end and a second end, where the first end of said first laser-cut means is connected to the output of said transmission gate;

(c) a first two-input nand gate, having a first input connected to the second end of said first laser-cut means, having a second input that traverses said cell, and having an output, where the first input to said first nand gate traverses said cell;

(d) a second two-input nand gate, having a first input connected to the output of said first nand gate, having a second input, and having an output that traverses said cell;

(e) a third two-input nand gate, having a first input that traverses said cell, having a second input that traverses said cell, and having an output connected to the second input of said second nand gate;

(f) a first inverter, having an input connected to the output of said second nand gate, and having an output that traverses said cell;

(g) a first tri-state clocked-inverter, having an input connected to the output of said first inverter, having a clock-input connected to the second control-input of said transmission gate, and having an output connected to the output of said transmission gate;

(h) a second laser-cut means comprising a metal line having a first end and a second end, where the first end of said second laser-cut means runs the width of said cell;

(i) a second inverter, having a first input connected to the second end of said second laser-cut means, and having an output connected to the clock-input of said first tri-state clocked-inverter;

(j) a third inverter, having an input connected to the output of said second inverter, and having an output connected to the first control-input of said transmission gate;

(k) a second tri-state clocked-inverter, having an input connected to the output of said first inverter, having a clocked-input connected to the output of said second inverter, and having an output;

(l) a third laser-cut means comprising a metal line having a first end and a second end, where the first end of said third laser-cut means is connected to the output of said second tri-state clocked-inverter;

(m) a fourth two-input nand gate, having a first input connected to the second end of said third laser-cut means, having a second input that traverses said cell, and having an output, where the first input of said fourth nand gate traverses said cell;

(n) a fifth two-input nand gate, having a first input connected to the output of said fourth nand gate, having a second input, and having an output that traverses said cell;

(o) a sixth two-input nand gate, having a first input that traverses said cell, having a second input that traverses said cell, and having an output connected to the second input of said fifth nand gate;

(p) a fourth inverter, having an input connected to the output of said fifth nand gate, and having an output that traverses said cell;

(q) a third tri-state clocked-inverter, having an input connected to the output of said fourth inverter, having a clock-input connected to the output of said third inverter, and having an output connected to the output of said second tri-state clocked-inverter;

(r) a fourth tri-state clocked-inverter, having an input connected to the output of said fourth inverter, having a clock-input, and having an output;

(s) a first laser-link means, comprising
  (i) a first metal line,
  (ii) a second metal line adjacent to, and electrically isolated from, said first metal line; and
  (iii) a via over said first metal line and said second metal line so that said first metal line and said second metal line may be fused together with a laser, where the first metal line of said first laser-link means is connected to the input of said second inverter, and where the second metal line of said first laser-link means traverses said cell;

(t) a second laser-link means, comprising
  (i) a first metal line,
  (ii) a second metal line adjacent to, and electrically isolated from, said first metal line; and
  (iii) a via over said first metal line and said second metal line so that said first metal line and said second metal line may be fused together with a laser, where said first metal line of said second laser-link means is connected to the second metal line of said first laser-link means, and where said second metal line of said second laser-link means is connected to the clocked-input of said fourth tri-state clocked-inverter;

(u) a fourth laser-cut means comprising a metal line having a first end connected to the second metal line of said second laser-link means, and having a second end that traverses said cell;

(v) a fifth laser-cut means comprising a metal line having a first end connected to the output of said fourth tri-state clocked-inverter, and having a second end runs the width of said cell; and (w) a third laser-link means, comprising
  (i) a first metal line,
  (ii) a second metal line adjacent to, and electrically isolated from, said first metal line; and
  (iii) a via over said first metal line and said second metal line so that said first metal line and said second metal line may be fused together with a laser, where said first metal line of said third laser-link means is connected to the output of said fourth tri-state clocked-inverter, and where the second metal line of said third laser-link means traverses said cell.

2. The device of claim 1, wherein said transmission gate is comprised of:
  a) an n-channel transistor, having a drain, a gate, and a source; and
  b) a p-channel transistor, having a drain connected to the drain of said n-channel transistor, a gate, and a source connected to the source of said n-channel transistor.

3. The device of claim 1, wherein said first laser-cut means, said second laser-cut means, said third laser-cut means, said fourth laser-cut means, and said fifth laser-cut means are each comprised of a first-layer metal line having a first end and a second end.

4. The device of claim 1, wherein said first laser-link means, said second laser-link means and said third laser-link means are each comprised of:
  (i) a first top-layer metal line,
  (ii) a second top-layer metal line adjacent to, and electrically isolated from, said first top-layer metal line; and
  (iii) a via over said first top-layer metal line and said second top-layer metal line so that said first top-layer metal line and said second top-layer metal line may be fused together with a laser.

5. The device of claim 2, wherein said first laser-cut means, said second laser-cut means, said third laser-cut means, said fourth laser-cut means, and said fifth laser-cut means are each comprised of a first-layer metal line having a first end and a second end.

6. The device of claim 5, wherein said first laser-link means, said second laser-link means and said third laser-link means are each comprised of:
  (i) a first top-layer metal line,
  (ii) a second top-layer metal line adjacent to, and electrically isolated from, said first top-layer metal line; and
  (iii) a via over said first top-layer metal line and said second top-layer metal line so that said first top-layer metal line and said second top-layer metal line may be fused together with a laser.

* * * * *